US006829380B1

(12) United States Patent
Choo et al.

(10) Patent No.: US 6,829,380 B1
(45) Date of Patent: *Dec. 7, 2004

(54) OPTIMIZATION OF OPC DESIGN FACTORS UTILIZING AN ADVANCED ALGORITHM ON A LOW VOLTAGE CD-SEM SYSTEM

(75) Inventors: Bryan K. Choo, Mountain View, CA (US); Bhanwar Singh, Morgan Hill, CA (US); Sanjay K. Yedur, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 700 days.

This patent is subject to a terminal disclaimer.

(21) Appl. No.: 09/642,959

(22) Filed: Aug. 21, 2000

Related U.S. Application Data (60) Provisional application No. 60/200,322, filed on Apr. 28, 2000.

(51) Int. Cl.[7] ............................ G06K 9/00; G01N 21/00
(52) U.S. Cl. ..................... 382/144; 382/145; 356/237.5; 356/237.6; 250/492.22
(58) Field of Search .................................. 382/141, 142, 382/143, 144, 145, 146, 147, 148, 149, 150, 151; 430/4, 5, 6, 22, 396; 356/614, 615, 630, 237.5, 237.6, 237.1, 237.2, 237.3, 237.4; 700/56, 57, 58, 59, 121; 716/19, 20, 21; 250/491.1, 492.2, 492.22

(56) References Cited

U.S. PATENT DOCUMENTS

| | | | | |
|---|---|---|---|---|
| 5,331,370 A | * | 7/1994 | Rosner et al. ................. 355/53 |
| 5,698,346 A | | 12/1997 | Sugawara |
| 5,723,233 A | * | 3/1998 | Garza et al. .................... 430/5 |
| 5,801,954 A | * | 9/1998 | Le et al. ........................ 716/21 |
| 5,815,685 A | | 9/1998 | Kamon |
| 5,825,647 A | * | 10/1998 | Tsudaka ....................... 700/57 |
| 5,962,173 A | | 10/1999 | Leroux et al. |
| 6,078,738 A | * | 6/2000 | Garza et al. .................. 716/21 |
| 6,187,483 B1 | * | 2/2001 | Capodieci et al. ............. 430/5 |
| 6,194,104 B1 | * | 2/2001 | Hsu ............................... 430/5 |
| 6,268,093 B1 | * | 7/2001 | Kenan et al. ................. 430/30 |
| 6,329,107 B1 | * | 12/2001 | Lu ................................. 430/5 |
| 6,370,679 B1 | * | 4/2002 | Chang et al. ................. 716/19 |
| 6,373,975 B1 | * | 4/2002 | Bula et al. ................... 382/144 |
| 6,510,730 B1 | * | 1/2003 | Phan et al. ................... 73/105 |
| 6,642,529 B1 | * | 11/2003 | Subramanya et al. ..... 250/492.2 |
| 6,701,004 B1 | * | 3/2004 | Shykind et al. ............. 382/149 |

OTHER PUBLICATIONS

PCT International Search Report, International Application No. PCT/US01/10613, International Filing Date Feb. 4, 2001, dated Aug. 10, 2001, 3 pages.

* cited by examiner

*Primary Examiner*—Jingge Wu
*Assistant Examiner*—Ryan J. Hesseltine
(74) *Attorney, Agent, or Firm*—Eschweiler & Associates, LLC

(57) ABSTRACT

A system for evaluating optical proximity corrected (OPC) designs is provided. The system includes an analysis system for performing measurements relating to a segment of a feature. The analysis system is configured to determine a first image for the segment of the feature based upon the measurements. The analysis system determines a second image to facilitate analysis of the first image and evaluates OPC designs based upon comparisons of the first and second image.

11 Claims, 7 Drawing Sheets

OPTIMIZATION OF OPC DESIGN FACTORS UTILIZING AN ADVANCED ALGORITHM ON A LOW VOLTAGE CD-SEM SYSTEM

RELATED APPLICATION

This application claims priority to the provisional application Ser. No. 60/200,322 filed Apr. 28, 2000, which is entitled "Optimization of OPC Design Factors Utilizing an Advanced Algorithm on a Low Voltage CD-SEM System".

FIELD OF THE INVENTION

The present invention relates generally to photolithography process development, and more particularly relates to a system and method for selecting one of various available OPC designs for a feature based upon an application of an advanced algorithm in conjunction with a CD-SEM system.

BACKGROUND OF THE INVENTION

The minimum feature sizes of integrated circuits are continuously decreasing in order to increase the packing density of the various semiconductor devices formed thereby. With this size reduction, however, various steps within the integrated circuit fabrication process become more difficult. One such area within the semiconductor fabricating process which experiences unique challenges as feature sizes shrink is photolithography.

Photolithography involves selectively exposing regions of a resist-coated silicon wafer to form a radiation pattern thereon. Once exposure is complete, the exposed resist is developed in order to selectively expose and protect the various regions on the silicon wafer defined by the exposure pattern (e.g., silicon regions in the substrate, polysilicon on the substrate, or insulating layers such as silicon dioxide).

An integral component of a photolithography or pattern transfer system is a reticle (often called a mask) which includes a pattern thereon corresponding to features to be formed in a layer on the substrate. A reticle typically includes a transparent glass plate covered with a patterned light blocking material such as chrome. The reticle is placed between a radiation source producing radiation of a preselected wavelength (e.g., ultraviolet light) and a focusing lens which may form part of a stepper apparatus. Placed beneath the stepper is the resist-covered silicon wafer. When the radiation from the radiation source is directed onto the reticle, light passes through the glass (in the regions not containing the chrome mask patterns) and projects onto the resist-covered silicon wafer; In this manner, an image of the reticle is transferred to the resist.

The resist (sometimes referred to as the "photoresist") is provided as a thin layer of radiation-sensitive material that is typically spin-coated over the entire silicon wafer surface. The resist material is classified as either positive or negative depending on how it responds to the light radiation. Positive resist, when exposed to radiation becomes more soluble and is thus more easily removed in a development process. As a result, a developed positive resist contains a resist pattern corresponding to the dark regions on the reticle. Negative resist, in contrast, becomes less soluble when exposed to radiation. Consequently, a developed negative resist contains a pattern corresponding to the transparent regions of the reticle. For simplicity, the following discussion will describe only positive resists, but it should be understood that negative resists may be substituted therefor.

Figure 1:
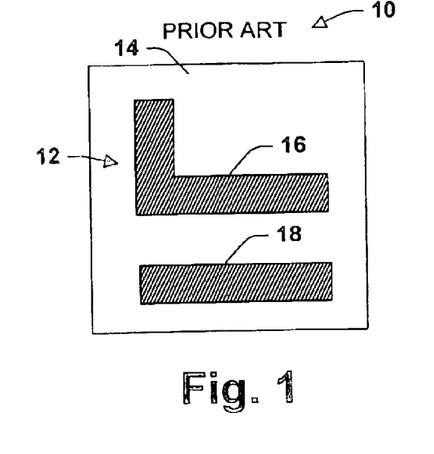
FIG. 1 is a plan view illustrating prior art mask layout data for various features.

An exemplary prior art reticle is illustrated in FIG. 1. Prior art FIG. 1 includes a reticle 10 corresponding to a desired integrated circuit pattern 12. For simplicity, the pattern 12 consists of only two design mask patterns. A clear reticle glass 14 allows radiation to project onto a resist covered silicon wafer. The chrome regions 16 and 18 on the reticle 10 block radiation to generate an image on the wafer corresponding to the desired integrated circuit design features.

As light passes through the reticle 10, it is refracted and scattered by the edges of the chrome 16 and 18. This causes the projected image to exhibit some rounding and other optical distortion. While such effects pose relatively little difficulty in layouts with large features (e.g., features with critical dimensions greater than one micron), they can not be ignored in present day circuit layouts where critical dimensions are about 0.25 micron or smaller. The problem highlighted above becomes even more pronounced in integrated circuit designs having feature sizes near the wavelength of the radiation employed in the photolithographic process.

Figure 2:
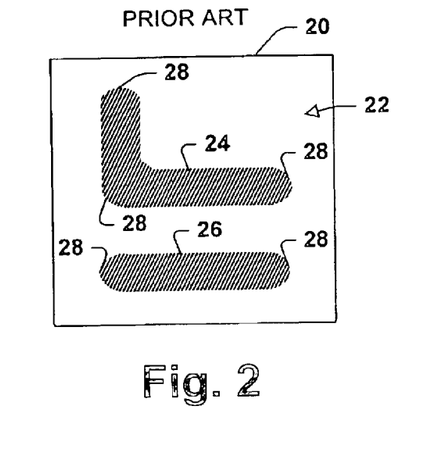
FIG. 2 is a plan view illustrating feature rounding on a substrate manufactured with a reticle having the mask layout data of FIG. 1.

Prior art FIG. 2 illustrates the impact of the diffraction and scattering caused by the radiation passing through the reticle 10 and onto a section of a photoresist covered silicon substrate 20. As illustrated, the illumination pattern on the substrate 20 contains an illuminated region 22 and two dark regions 24 and 26 corresponding to the chrome regions 16 and 18 on the reticle 10. The illuminated pattern 22, however, exhibits considerable distortion, with the dark regions 24 and 26 having their corners 28 rounded. Unfortunately, any distorted illumination pattern propagates through the developed resist pattern and negatively impacts the integrated circuit features such as polysilicon gate regions, vias in dielectrics, etc. As a result, integrated circuit performance is degraded.

To remedy this problem, a reticle correction technique known as optical proximity correction (OPC) has been developed. OPC involves the adding of dark regions to and/or the subtracting of dark regions from portions of a reticle to overcome the distorting effects of diffraction and scattering. Typically, OPC is performed on a digital representation of a desired integrated circuit pattern. This digital representation is often referred to as the mask layout data and is used by the reticle manufacturer to generate the reticle. First, the mask layout data is evaluated with software to identify regions where optical distortion will result. Then the OPC is applied to compensate for the distortion. The resulting pattern is ultimately transferred to the reticle glass.

Figure 3:
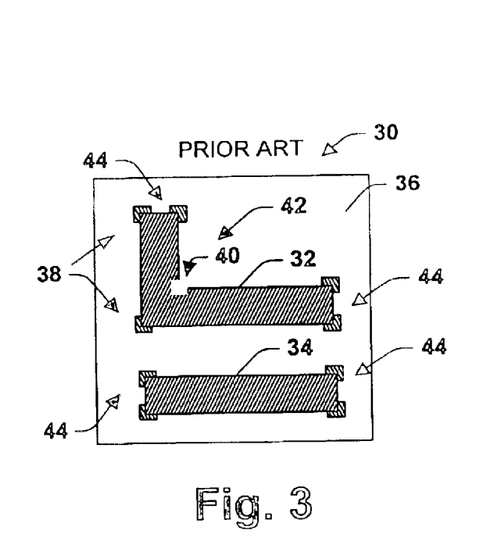
FIG. 3 is a plan view illustrating prior art mask layout data for various features employing conventional optical proximity correction.

Prior art FIG. 3 illustrates how OPC may be employed to modify the reticle design illustrated in FIG. 1 and thereby provide more accurately the desired illumination pattern at the substrate. As shown, an OPC-corrected reticle 30 includes two features 32 and 34 outlined in chrome on the glass plate 36. Various corrections 38 have been added to the base features. Some correction takes the form of "serifs." Serifs are typically small, appendage-type addition or subtraction regions typically made at corner regions or other areas on reticle designs.

Figure 4:
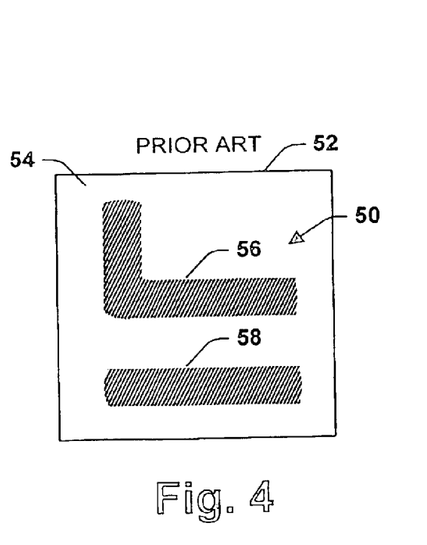
FIG. 4 is a plan view illustrating reduced feature rounding on a substrate manufactured with a reticle having the mask layout data of FIG. 3.

Prior art FIG. 4 illustrates an illumination pattern 50 produced on a photoresist covered wafer surface 52 by radiation passing through the reticle 30 of prior art FIG. 3. As shown, the illuminated region includes a light region 54 surrounding a set of dark regions 56 and 58 which substantially faithfully represent the desired pattern illustrated in prior art FIG. 1. Note that the illumination pattern 22 of prior art FIG. 2 which was not produced with a reticle having OPC (reticle 10) has been improved greatly by the reticle 30 having OPC.

Figure 5:
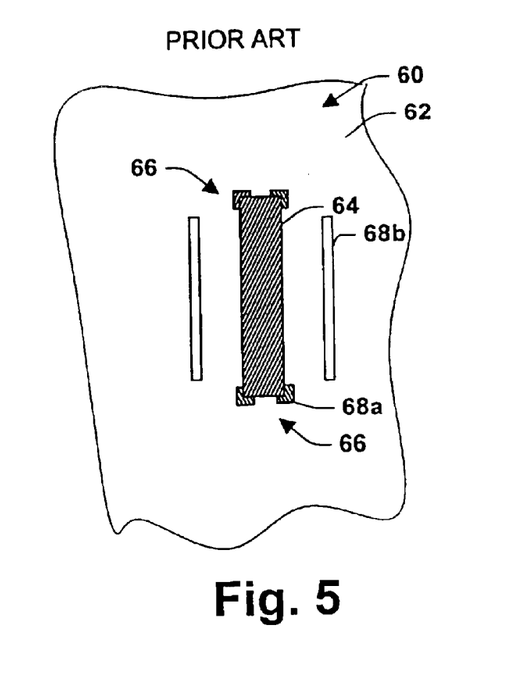
FIG. 5 is a fragmentary plan view of a feature employing an OPC design.
Figure 6:
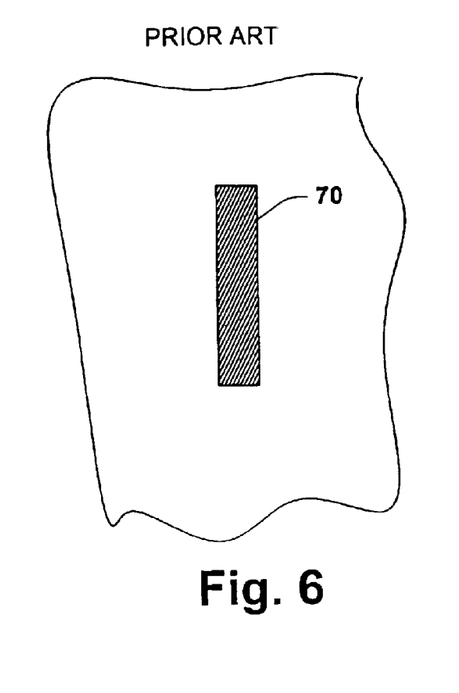
FIG. 6 is a fragmentary plan view of an ideal feature which corresponds to the feature of FIG. 5.

Although OPC designs provide performance improvements over features which do not employ OPC as illustrated in prior art FIGS. 1–4, presently there is not a suitable method for determining whether one type of OPC design is better than another. That is, it is difficult to determine which OPC design is the optimal design for a given feature even with the most advanced simulation equipment. As illustrated in prior art FIG. 5, a feature 60 on a mask 62 has a core portion 64 with an OPC design 66 applied thereto. The OPC design 66, however, may include different types of serifs 68a, and assist structures 68b of various dimensions at various locations about the feature 60. For example, the serif 68a may attach to the core portion 64 at various points and thus may vary substantially in its dimensions. In addition, the assist structure 68b may have a variable width, a variable length, and may exist at various distances away from the core portion 64. Presently, however, there is not an efficient way of evaluating whether one type of OPC design is better than another in achieving its goal, namely to produce a feature on a substrate which substantially approximates an ideal feature 70, as illustrated in prior art FIG. 6.

Figure 7:
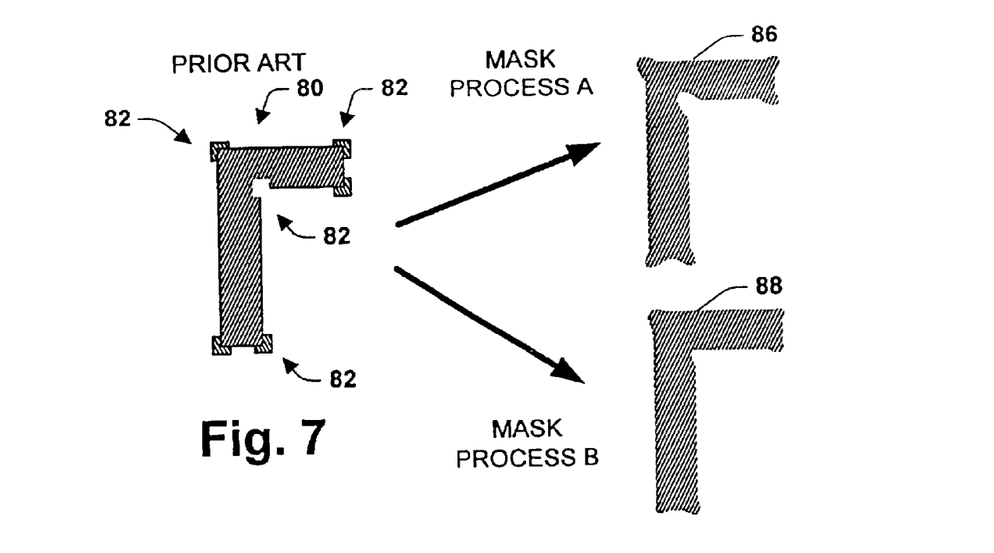
FIG. 7 is a plan view of mask layout data showing a mask pattern having optical proximity correction and two generated mask patterns which approximate an ideal mask pattern which were formed using different mask fabrication processes.

Another problem associated with the analysis of OPC designs for a given feature is in analyzing the mask fabrication process which is employed in fabricating the mask. As illustrated in prior art FIG. 7, a portion of mask layout data associated with a core feature 80 having an OPC design 82 is used to generate a pattern on a mask (i.e., a mask pattern). As illustrated in prior art FIG. 7, different mask fabrication processes for a given feature result in mask patterns that approximate the intended feature having the OPC, but nevertheless differ from one another. For example, the mask pattern 86 formed by the mask fabrication process A of prior art FIG. 7 may have been generated using a dry etch while the mask pattern 88 formed by the mask fabrication process B may have been generated using a wet etch which caused the mask patterns 86 and 88 to differ. Given the fact that different mask fabrication processes provide mask patterns which approximate the intended OPC design, but differ from one another, one must evaluate which mask fabrication process is the optimal process to utilize in order to maximize the benefits provided by OPC.

Presently, conventional CD-SEM systems do not provide an efficient and automated system for evaluating OPC designs. Although conventional CD-SEM systems may automatically collect linewidth measurement data, the interpretation of such data is a substantially manual and time-consuming process. Consequently, it would therefore be desirable to further improve upon conventional OPC evaluation techniques by improving the capabilities of conventional CD-SEM systems.

SUMMARY OF THE INVENTION

The present invention relates to a system and method of characterizing features having optically corrected designs by utilizing an algorithm in conjunction with a CD-SEM system. More specifically, the CD-SEM system is configured to provide critical dimension measurements over regions of an optical proximity corrected (OPC) feature. The regions may be determined as geometrical shapes, for example, by configuring the CD-SEM system to provide a plurality of measurements in and over multiple scanning directions of a feature. From the area measurement regions, graphical and numerical analysis may then be performed to determine differences between various designs. Additionally, numerical and/or graphical analysis of the present invention may also be applied to features which have been subjected to different mask fabrication processes. Based upon the analysis, an optimal OPC design and/or process may be rapidly and efficiently selected. Thus, painstaking manual analysis of critical dimension data as provided by prior art methods is mitigated, and subjective interpretation of the critical dimension measurements is substantially eliminated.

According to one aspect of the present invention, a system and method of characterizing features having different OPC designs is provided. A first OPC design, having a first set of features, forms an input data set and may be characterized by spatially measuring segmented area regions of the features. The measured segments from various portions of the features are then combined and presented in a graphical sequence (e.g., a computer monitor display). Another OPC design providing comparable features is also then similarly characterized and presented as a graphical overlay to the previous display image. From the graphical comparison of the two data sets, an efficient and rapid determination may be made as to which design provides the best representation of a desired feature. By graphically observing the displayed features as an overlay, feature determinations such as corner rounding, pull-back and end rounding may be efficiently determined.

According to another aspect of the present invention, a feature produced from an OPC design is compared to an idealized model of a desired feature. By performing a difference analysis between the idealized model and the actual feature, a determination may be made as to the effectiveness of any particular OPC design and deviations from the idealized model. Additionally, OPC designs may be characterized by performing a curve fitting analysis based upon deviations of the actual feature and the idealized model.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

The following is a detailed description of the present invention made in conjunction with the attached Figures, wherein like reference numerals refer to like elements throughout.

The present invention relates to a system and method of characterizing features employing differing OPC designs. In one aspect of the invention, portions of a feature from a first OPC design are defined and measured by a CD-SEM system in multiple directions over a feature's surface area. The measurements from the segmented portions are then combined to determine a shape (e.g., a graphical outline) over a given area. Another OPC design may then be similarly characterized. The resultant shapes are then subjected to graphical and/or mathematical analysis in accordance with the present invention to select the OPC design which yields the optimal pattern transfer characteristics. Alternatively, OPC designs may be qualified by analyzing a feature in conjunction with an idealized model of the desired feature. The analysis may include mathematical regression on portions of the feature. Also, subtraction techniques may be employed to determine deviations between the actual feature and the idealized feature, as may be desired.

The present invention also provides a system and method for characterizing features that have been subjected to alternative mask fabrication processes. By employing graphical and/or numerical evaluation as described above to features which have undergone alternative fabrications, a rapid and efficient evaluation may be performed and a process may be selected which provides feature characteristics that are closest to a desired feature.

Figure 8:
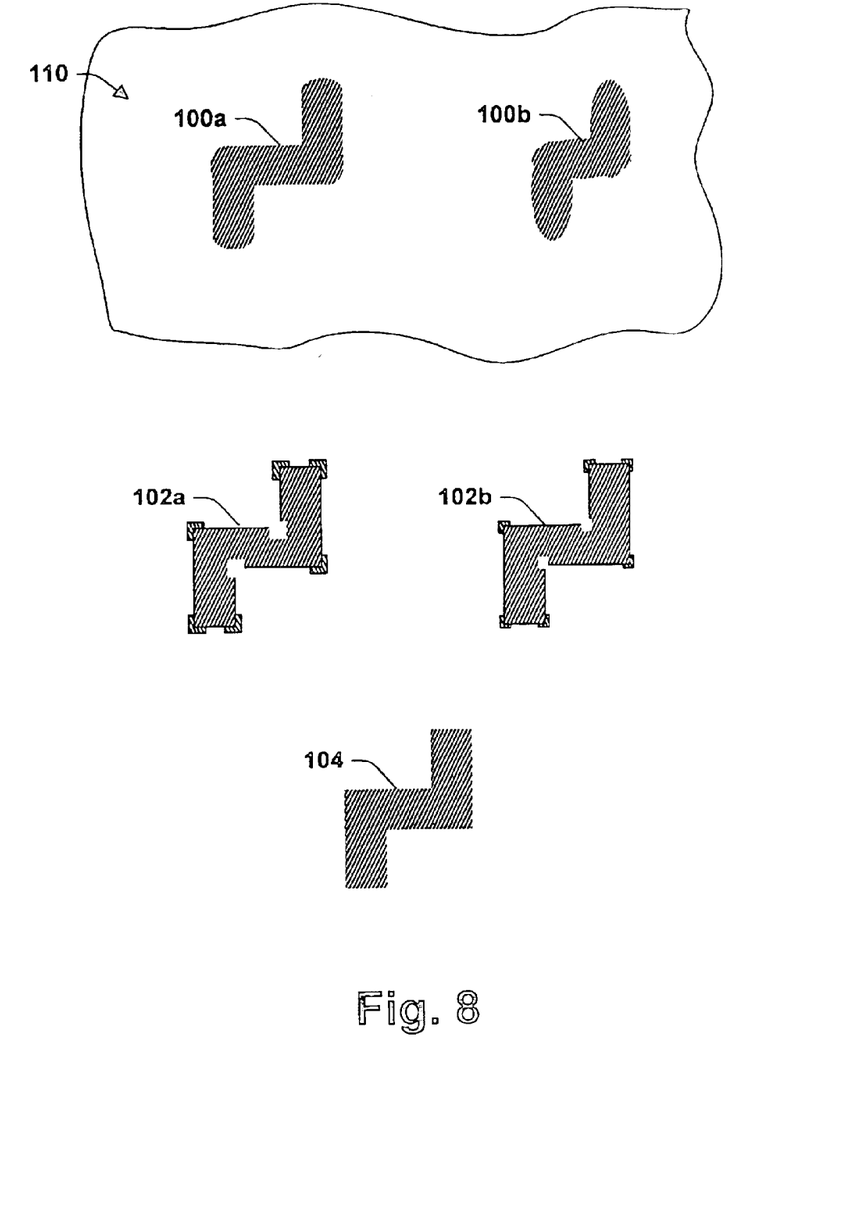
FIG. 8 is a plan view of multiple features which have been fabricated from multiple OPC designs.

Turning now to FIG. 8, features 100a and 100b are depicted which have been formed in a resist or on a wafer 110 in accordance with OPC designs 102a and 102b, respectively. OPC designs 102a and 102b represent alternative designs for producing an ideal feature 104. After the features 100a and 100b have been produced on the wafer 110, a CD-SEM system 200 (see, e.g., FIG. 12) is employed to provide measurement information over selected portions of the features. From the measurements, graphical and/or mathematical analysis may be employed to determine the optimal OPC design 102a or 102b providing the most desirable feature (e.g., one that most closely approximates the ideal feature 104) in accordance with the present invention.

Figure 9A:
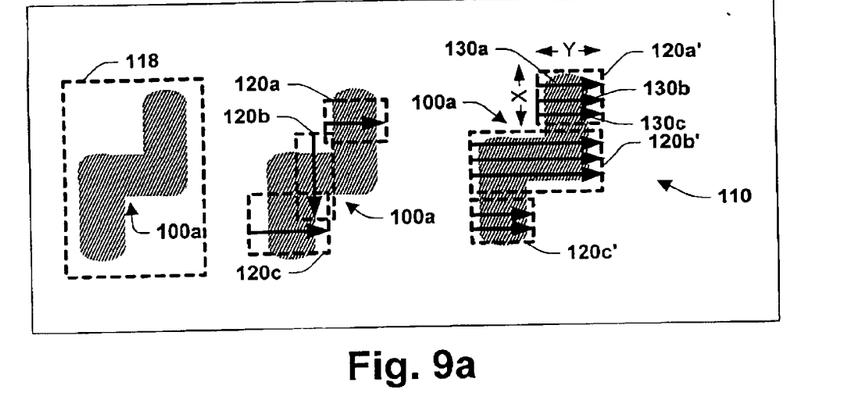
FIG. 9a illustrates a scan area measurement in accordance with the present invention.

Referring to FIG. 9a, scan regions are defined for the feature 100a and illustrate an aspect of the present invention for evaluating OPC designs. In accordance with the present invention, scan regions may be defined in order to determine the edges of the feature 100a. An overall scan region may be defined as a single shape 118 (e.g., rectangles, circles, ovals, boxes, etc.) and/or as a plurality of shapes 120a, 120b and 120c, for example. The shapes direct the CD-SEM to search the enclosed regions for the edges of the feature 100a. Generally, the shapes do not fit tightly around the feature but encompass the desired feature and a portion of the surrounding area. It is noted the shapes may be drawn via graphics software and a mouse as is well known in the art. It is further noted that the scan direction (e.g., horizontal, vertical) for the CD-SEM may also be defined as illustrated by the arrows in boxes 120a, 120b, and 120c.

Figure 9B:
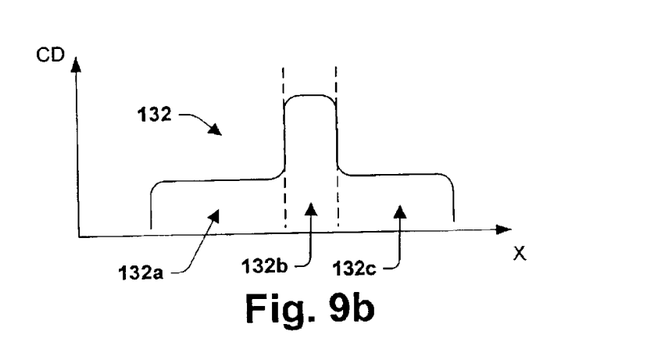
FIG. 9b illustrates a graphical representation of the measurements of FIG. 9a in accordance with the present invention.

After the shapes have been defined for a desired scan area, portions of the shape of the feature may be determined by directing a plurality of CD-SEM measurements over the defined region of the shape. Beginning at a first interval portion of shape 120a', a CD-SEM measurement slice 130a may be taken over the distance Y. According to the resolution of the CD-SEM system, or in accordance with predetermined measurement intervals, succeeding measurement slices 130b, 130c, etc. of the feature along X are taken over the interval of Y. After a plurality of measurements slices have been taken along the Y interval, an exemplary graphical construction of the measurements is shown as region 132a in FIG. 9b. Referring back to FIG. 9a, regions 120b' and 120c' may be similarly measured by the CD-SEM system. As shown in FIG. 9b, graphical construction of regions 120b' and 120c' are depicted as regions 132b and 132c. The collective sequence of graphical regions 132a, 132b, and 132c is herein referred to as the image 132.

Figure 9C:
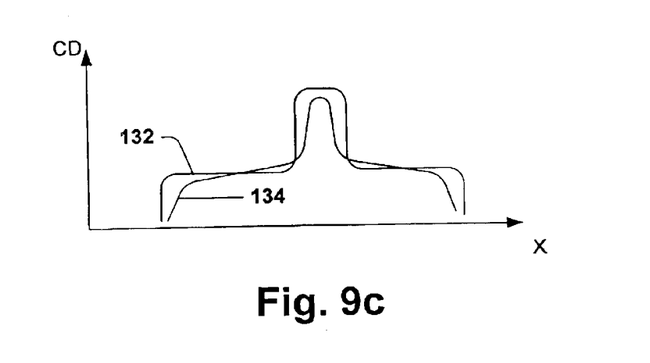
FIG. 9c illustrates a graphical comparison of features employing differing OPC designs in accordance with the present invention.

According to one aspect of the present invention, the feature 100b depicted in FIG. 8 is then scanned and measured as described above. Referring to FIG. 9c, the results of the region measurements of feature 100b may then be plotted as an overlay image 134 to the image 132 plotted from the feature 100a. Images 132 and 134 are shown as an overlay according to the region measurements of features 100a and 100b. As can be readily observed from the overlay, the graphical construction 132 associated with feature 100a is a more true representation of the desired feature 104 depicted in FIG. 8. The graphical construction 134 depicts a much rounder and less visually discrete version of the feature 104. Therefore, based on a graphical comparison, one may determine quickly that the feature associated with OPC design 102a better approximates the ideal feature 104.

According to another aspect of the present invention, features 100a and 100b depicted in FIG. 8 for example, may employ the same OPC design, yet employ alternative mask fabrication processes. By applying the graphical analysis of the present invention as described above, and/or numerical analysis described below, a fabrication process may be selected which provides the best approximation of the ideal feature 104.

The graphical comparison of features from alternative OPC designs and/or processes, provides a substantially more rapid and efficient method for analyzing competing designs. According to conventional systems, CD-SEM measurements are taken from various portions of a feature. Based upon the measurements, manual data analysis often includes exhausting and time consuming subjective determinations of the various measurements. In accordance with the present invention, mitigation of manual analysis of CD-SEM data is achieved. By overlaying competing OPC designs according to defined regions, one may rapidly determine via a quick and efficient visual analysis which OPC design should be selected. Additionally, since features may be defined according to segments, a portion of one OPC design may provide a more accurate representation of a corresponding first portion of the ideal feature 104, while a portion from a second OPC design may provide a more accurate representation of a corresponding second portion of the ideal feature 104. This enables desired features from competing designs to be efficiently selected and combined for subsequent determinations of ideal OPC designs and/or fabrication processes.

In accordance with another aspect of the present invention, features may be analyzed with respect to an idealized model of the intended feature. This enables the CD-SEM system 200 which is described in more detail below to perform a substantially objective analysis on a feature and substantially automate the OPC evaluation process. The analysis may be performed via an image overlay comparison of the measured feature and the idealized model. By determining differences between the model and the feature, the feature, and hence, the OPC design may be objectively analyzed. Thus, considerable time and expense may be saved over conventional manual analysis systems. Additionally, mathematical analysis techniques such as regression may be applied to evaluate the differences between the ideal model and the feature.

Figure 10:
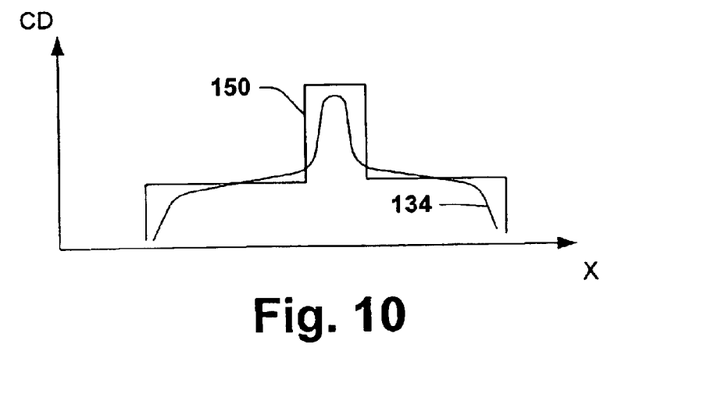
FIG. 10 illustrates a comparison of an idealized feature and an OPC feature in accordance with the present invention.

Referring now to FIG. 10, the feature 100b as shown in FIG. 8 may be scanned as an image 134 and aligned with an ideal model of the feature 150 in order to provide an alternative analysis in accordance with the present invention. The alignment, may occur by minimizing distances (e.g., pixel distances) between the image 134 and the ideal model 150. For example, the memory region defined by the model 150 may occupy a first data set within the CD-SEM memory (See e.g., FIG. 12 ref. numeral 460). The scanned feature 100b may then occupy a second data set within memory. Alignment of the scanned image 134 with the model 150 may then occur by minimizing the sum of the squares distances between the scanned image and the model. More particularly, image alignment may be achieved by first determining the difference between individual pixel points (e.g., subtraction) in the respective images and then minimizing the sum of the squares between the respective points.

In accordance with an aspect of the present invention, after image alignment has occurred as described above, a pixel by pixel comparison (e.g., digital subtraction, mean distance between aligned pixels, etc.) may be performed between the data sets to determine the degree of overall difference between the image 134 data set and the model 150 data set. For example, after comparing the two data sets, it may be determined that there are 20 percent differences between the region defined by the model 150 and the region defined by the feature for a first OPC design. When analyzing a second OPC design, the CD-SEM system may determine that only 10 percent differences exist between the model 150 data set and the feature data set. The system may also be configured to report the overall ranking of the OPC designs and the objective results of the analysis.

According to another aspect of the present invention, a more detailed analysis may be performed on the differences between the model 150 and the image 134. For example, objective criteria of feature evaluation may include the degree of corner rounding the degree of end rounding, and the degree to which lines have pulled-back (line length shorter than the intended dimension because of rounding).

The degree of either corner or end rounding may be determined by analyzing a portion of the feature data set defined by a region of the model 150. For example, referring to FIG. 11a, the outermost data pixels 160a, which approach an end 150a of the idealized feature 150, define a curved relationship and may be characterized according to the degree of end rounding. Likewise, the pixels, 160b may be characterized according to the degree of corner rounding. By selectively determining which portion of the idealized model to analyze, the CD-SEM system 200 may be configured to qualify regions according to predefined regions of the model. Line pull-back, which is shown as reference numeral 160c, may be determined, for example, by analyzing the pixel distance between the end of the feature 160a and the end of the model 150a. For example, the distance may be determined after the model and the scanned image are aligned as described above, then determining the number of horizontal pixels defined by the region 160c.

Figure 11A:
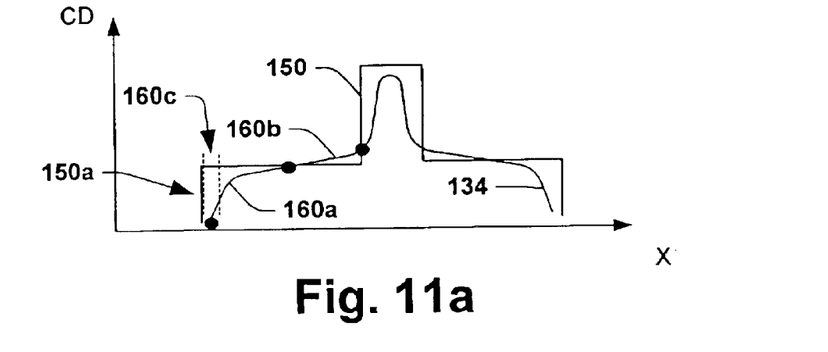
FIG. 11a illustrates regions of an OPC feature that are subjected to a numerical analysis in accordance with the present invention.
Figure 11B:
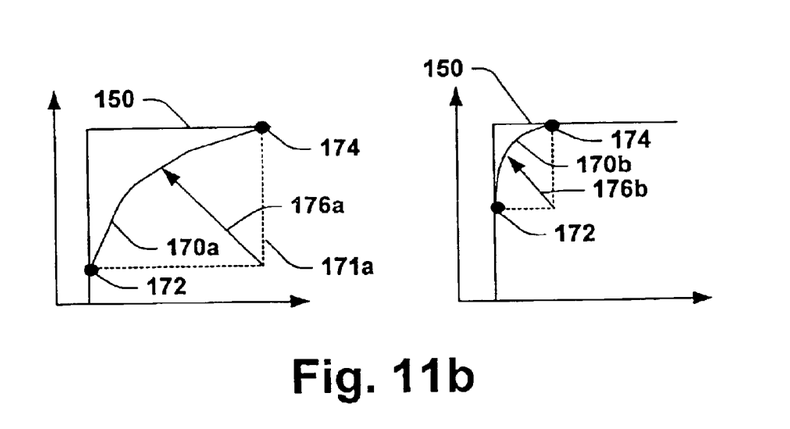
FIG. 11b illustrates a corner rounding determination in accordance with the present invention.

Referring now to FIG. 11b, corner rounding as described above may be determined according to an aspect of the present invention. An OPC corrected feature 170a may be analyzed with respect to the amount of corner rounding associated therewith in relation to an ideal feature 150. For example, the analysis may occur by aligning the ideal image 150 with the corrected feature 170a, as described above, and determining a best fit radial line 171a to the corner of the feature 170a.

The line 171a may be determined, for example, by determining a first deviation point 172 wherein the corrected feature 170a approximately begins to diverge from the ideal model 150. A second point 174 may then be determined about at the point wherein the corrected feature 170a and the ideal model begin to converge. From the two points 172 and 174, the radial line 171a may then be determined by computing the horizontal and vertical pixel distances to the origin of a vector 176a (e.g., radius line). From the origin, the distance represented by the vector 176a may then be determined. It is to be appreciated that any suitable trigonometric (e.g., Pythagorean theorem) and/or other mathematical process as is understood in the art may be employed to compute the vector 176a. It is further to be appreciated that vector 176a may be determined by computing the average of several measurements and/or distances from the two points 172 and 174 and along the length of radial line 171a. Alternatively, a least squares fit for a circle and/or ellipse may be applied to the curve between points 172 and 174 to determine the degree of corner rounding.

By determining a vector as described above for a feature, a threshold may be determined for the desired amount of corner rounding. Based upon the length of the vector, the threshold may be set wherein vectors above a predetermined length may be rejected. Alternatively, competing OPC designs may be compared for corner rounding by comparing respective lengths of the vectors. For example, referring to FIG. 11b, a second OPC corrected feature 170b displays less corner rounding than the feature 170a. As shown, a vector 176b may be smaller in length when a competing OPC design provides a more suitable feature 170b whereby less corner rounding may be present.

Referring back to FIG. 11a, and in accordance with an alternative aspect of the present invention, a curve fitting analysis may be applied to the pixel data set described above to determine the pixel data set shape (e.g., flat shape, parabolic shape) in the measured region. Many techniques are available for fitting particular data to a linear region and/or to a curve. The present invention may apply a linear and/or polynomial regression to determine the amount of flatness or curvature in the desired region. Upon determining a "best fit" for a desired region via the regression analysis, a difference in slopes between the model region and the scanned region may then be determined to analyze the closeness between the respective regions. It is to be appreciated, however, that many other well known methods for curve fitting and/or regression may be applied to determine the shape of the desired region and each such method is contemplated as falling within the scope of the present invention.

According to an aspect of the present invention, a "best fit" criteria may be employed for determining whether a given data set is more closely modeled by a linear or polynomial equation. The best fit may be determined by performing a statistical analysis on the actual data in conjunction with predicted data values of the linear or polynomial equations. Based upon the outcome of the statistical analysis, a determination is made as to whether the data is more closely related to the linear model and/or to the higher order polynomial model. For example, if the pixel data set 160a illustrated in FIG. 11a is relatively linear (e.g., linear arrangement of pixels), the statistical analysis will show a substantially higher correlation (e.g., better fit, best fit criteria closer to 1 as described in more detail below) for the linear model than the polynomial model. By utilizing the best fit criteria, OPC designs may be objectively evaluated as to which designs provide the closest fit to the model in relation to the portion of the feature being evaluated.

A set of equations will now be described in more detail to further illustrate the workings of the present invention. A linear equation for fitting a set of data is shown in Equation 1 below.

$$y = a_0 + a_1 X + e \qquad \text{Equation 1:}$$

(wherein e represents the residual or error between the mathematical model and the actual data).

This equation may be extended for equations of a higher order as shown in Equation 2.

$$y = a_0 + a_1 X + a_2 X^2 + \ldots + a_m X^m + e \qquad \text{Equation 2:}$$

An approach to fitting the actual data (determining the coefficients to the above equations) to Equations 1 and 2, is to minimize the sum of the squares of the residuals as shown in Equations 3 and 4.

Equation 3:
$$Sr = \sum_{i=1}^{n} e_i^2 = \sum_{i=1}^{n} (y_i - a_0 - a_1 X)^2$$

wherein Sr represents the sum of the squares of the residuals.

Equation 4:
$$Sr = \sum_{i=1}^{n} (y_i - a_0 - a_1 X - a_2 X^2 - \ldots - a_m X^m)^2$$

From these equations, a coefficient of determination may be determined. The coefficient of determination is then employed to determine whether the data is best fit to a linear equation and/or polynomial equation. The coefficient of determination or $r^2$ may be determined as follows:

$$r^2 = (S_t - S_r)/S_t \qquad \text{Equation 5:}$$

wherein St is the total sum of the squares around the mean of the dependent variable y and represents the uncertainty associated with the dependent variable prior to regression. If $r^2$ is close to the value of 1 after applying Equation 5, then the actual data is closely or best fit to the linear or polynomial equations described above. The following discussion is related to a numerical example to illustrate the workings of the present invention.

Curvature of the pixel data set may be obtained, for example, by fitting an $m^{th}$ order polynomial to the pixel data as shown in Equation 2. Alternatively, Equation 1 may be applied to determine if the data points are best fit to a linear equation. For example, a $2^{nd}$ order polynomial (generally having a parabolic or curved shape) may be fit to the pixel data representing the curved portion 160a. Equation 2 and Equation 4 may be manipulated to form a set of equations for determining the coefficients of an $m^{th}$ order polynomial to fit the given data as shown in Equations 6 through 8.

$$a_0 n + a_1 \Sigma Xi + a_2 \Sigma Xi^2 + \ldots + a_m \Sigma Xi^m = \Sigma Yi \qquad \text{Equation 6:}$$

$$a_0 \Sigma Xi + a_1 \Sigma Xi^2 + a_2 \Sigma Xi^3 + \ldots + a_m \Sigma Xi^{m+1} = \Sigma XiYi \qquad \text{Equation 7:}$$

$$a_0 \Sigma Xi^2 + a_1 \Sigma Xi^3 + a_2 \Sigma Xi^4 + \ldots a_m \Sigma Xi^{m+2} = \Sigma Xi^2 Yi \qquad \text{Equation 8:}$$

whereby n is the number of points to be fit, and m is the degree to which the data points are to be fit.

By selecting a threshold for $r^2$ as shown in Equation 5 above, a determination may be made as to the best fit of the linear or polynomial equation. For example, a linear and polynomial equation may be fit to a given data set for a desired region of a feature. If the $r^2$ computation were to confirm a high correlation ($r^2$ approximately equal to 1) to the linear model for the region of interest, then a determination may be made that the OPC design for that region provided a substantially close approximation to a line. A slope may then be determined for the line as is well understood in the art to determine whether the slope for the selected region was near zero, for example. The closer the slope was to zero, the closer the measured feature would be to the desired model. For example, as illustrated in FIG. 11a, if the section between points 160a and 160b were near zero, the corrected feature would more closely match the ideal feature 150. Thus, the numerical analysis of the optically corrected region would provide an improvement over manually driven conventional CD-SEM systems.

Figure 12:
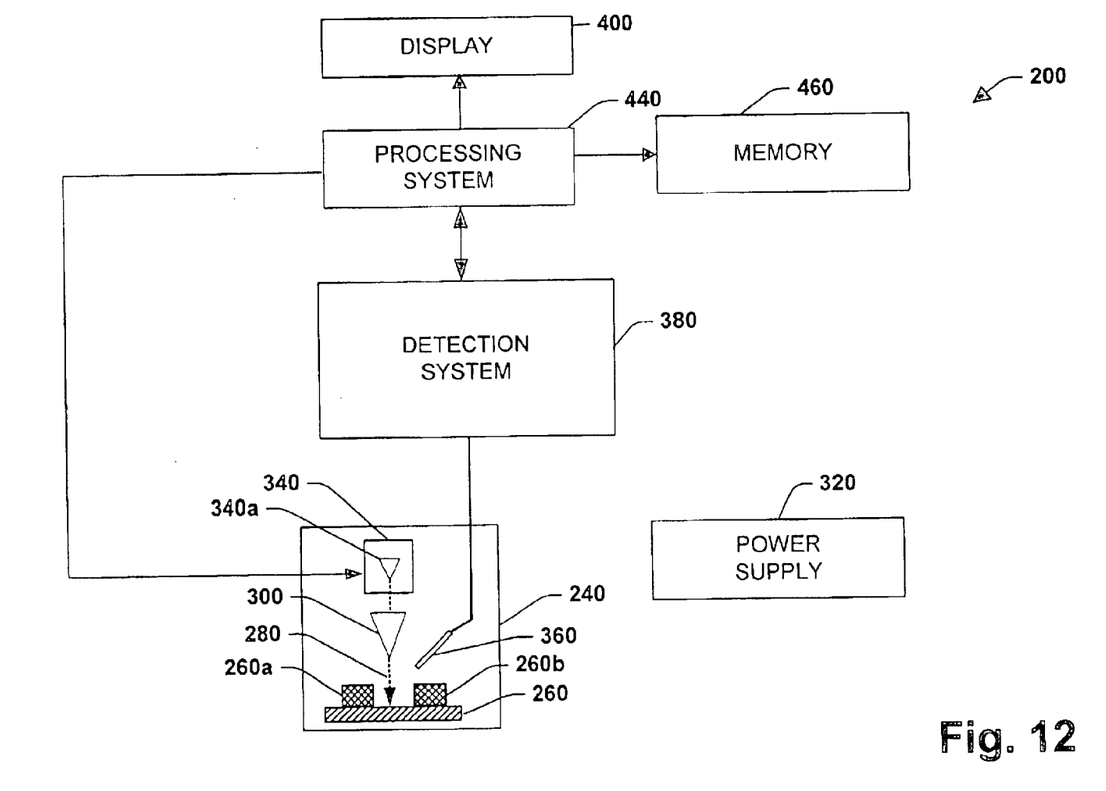
FIG. 12 illustrates a CD-SEM system for evaluating OPC designs in accordance with the present invention.

Now referring to FIG. 12, a CD-SEM system 200 is shown for providing feature analysis and OPC evaluation in accordance with the present invention. The system includes a chamber 240 for housing a wafer 260. An electron beam 280 is directed from an electromagnetic lens 300 toward the wafer 260. The electron beam 280 is created from a high voltage supplied by a power supply 320 associated with a beam generating system 340 which includes an emission element 340a. Various directing, focusing, and scanning elements (not shown) in the beam generating system 340 guide the electron beam 280 from the emission element 340a to the electromagnetic lens 300. The electron beam particles may be accelerated to energies from about 500 eV to about 40 KeV. When the electron beam 280 strikes the surface of the wafer 260, electrons and x-rays are emitted which are detected by a detector 360 and are provided to a detection system 380. The detection system 380 provides digitized detector signals to a processing system 440 for performing critical dimension measurements and feature analysis in accordance with the present invention.

Electrons which are emitted from the surface of the wafer 260 which are most useful for critical dimension imaging are known as secondary electrons and provide a substantial amount of the signal current received by the detector 360. A critical dimension image may also be directed to a display 400 by the processing system 440. The processing system 440, in addition to analyzing data received by the detection system 380, may synchronize the scanning of the display 400 with electron beam scanning of the wafer 260 to provide the image. Contrast of the displayed image is related to variations in the flux of electrons arriving at the detector 360 and is related to the yield of emitted electrons from the surface of the wafer 260 to the incident electrons from the electron beam 280.

The detection system 380 receives the electron emissions from the wafer surface via the detector 360 and preferably digitizes the information for the processing system 440. In addition, the detection system 380 may also provide filtering or other signal processing of the received signal. The processing system 440 provides critical dimension information to the display 400 and/or stores information in a memory 460. A processor (not shown) is included in the processing system 440 for controlling the beam generating system 340, providing critical dimension measurements, and for performing signal analysis in accordance with the present invention. It is to be appreciated that a plurality of processors and/or processing systems may be included as part of and/or external to the CD-SEM system 200 for performing signal analysis in accordance with the present invention. As will be described in more detail below, signals received from wafer surface measurements are digitized and analyzed as a data set. By analyzing the data (e.g., by employing regression mathematics to the data set), a shape (e.g., flat, curved) for the data set may be determined to qualify the effectiveness of an OPC design.

The processor in the processing system 440 is programmed to control and operate the various components within the CD-SEM system 200 in order to carry out the various functions described herein. The processor may be any of a plurality of processors, such as the AMD Athlon., K6 or other type architecture processors. The manner in which the processor may be programmed to carry out the functions relating to the present invention will be readily apparent to those having ordinary skill in the art based on the description provided herein and are omitted herein for the sake of brevity.

A memory 460 is also included in the system 200. The memory 460 is operatively coupled to the processing system 440 and serves to store program code executed by the processor for carrying out operating functions of the system 200 as described herein. The memory 460 also serves as a storage medium for temporarily storing information such as curve fitting data, critical dimension data, statistical data, and other data which may be employed in carrying out the present invention.

The power supply 320 also provides operating power to the CD-SEM system 200 along with providing a high voltage to the beam generating system 340. Any suitable power supply (e.g., linear, switching) may be employed to carry out the present invention.

Figure 13:
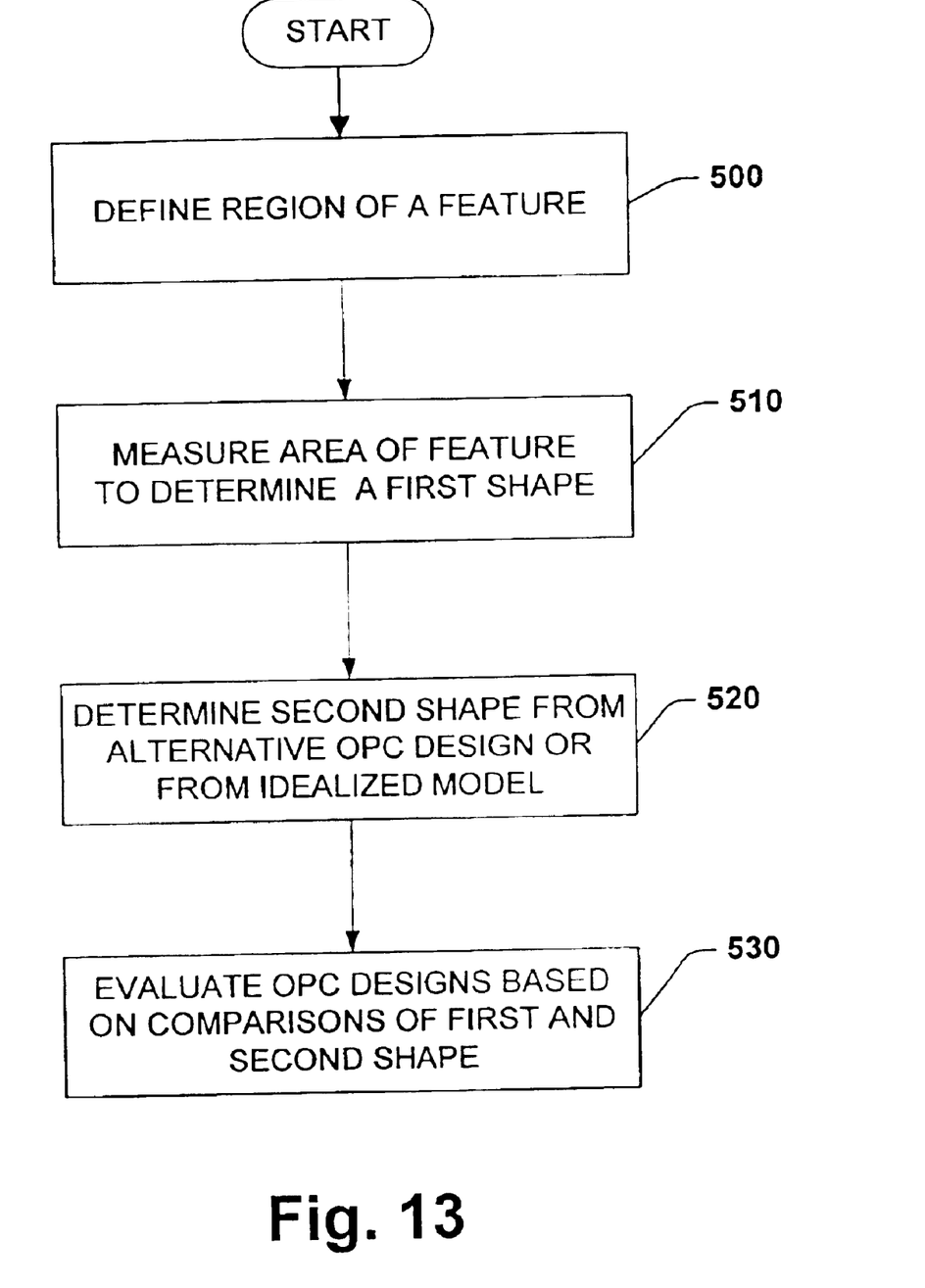
FIG. 13 illustrates a flow diagram methodology for evaluating OPC designs in accordance with the present invention.

Now referring to FIG. 13, a flow chart illustrates a methodology for evaluating OPC designs in accordance with the present invention. At step 500, a region is defined for at least a portion of an optically corrected feature. As described above, the region may be defined by a shape, such as a rectangle, which may be either manually determined or determined by the system based on the contrast of the feature outline. Proceeding to step 510, the shape which was defined in step 500 is measured (e.g., according to a set of sequential measurements) across the area defined by the shape. Based on the measurements, a feature outline is determined and may be provided to a graphics display and stored in memory as a pixel data set.

Proceeding to step 520, a second feature having a different OPC design is characterized as described above in steps 500 and 510. Alternatively, an ideal feature can be produced from the geometric outline of the intended feature if the feature were produced and no distortions were to occur from optical effects. At step 540, the second feature and/or idealized feature are displayed as a graphical overlay to the first feature that was defined in steps 500 and 510. By overlaying the features, a rapid visual evaluation may occur as to which OPC design more closely follows the desired or intended feature. Additionally, the ideal model may be employed to determine differences between the OPC corrected feature associated therewith. These differences may be characterized via subtraction techniques as described above, and/or via curve fitting analysis at the corners and edges of the measured feature.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application. Furthermore, to the extent that the term "includes" is used in either the detailed description or the claims, such term is intended to be inclusive in a manner similar to the term "comprising".

What is claimed is:

1. A system for evaluating optical proximity corrected (OPC) designs, comprising:

an analysis system for performing measurements relating to at least one segment of a feature;

wherein the analysis system is configured to determine a first image corresponding to the at least one segment of the feature, the analysis system determines a second image to facilitate analysis of the first image, the analysis system evaluates OPC designs based upon comparisons of the first and second images, wherein the second image is determined from a corresponding segment of another feature having a different mask fabrication process.

2. The system of claim 1 wherein the analysis system is a CD-SEM system.

3. The system of claim 1 wherein the second image is determined from a corresponding segment of another feature having a different OPC design.

4. The system of claim 1 wherein the evaluation of OPC designs is determined by graphical comparisons of the first and second images.

5. The system of claim 1 wherein the evaluation of OPC designs is determined by graphical comparisons of the first image and the second image.

6. The system of claim 1 wherein the evaluation of OPC designs is determined by a regression analysis.

7. The system of claim 1 wherein the comparison of the first and second image is based upon a digital subtraction.

8. The system of claim 1 wherein the comparison of the first and second image provides information relating to corner rounding, end rounding or structure pull-back.

9. The system of claim 1 wherein the at least one segment is determined manually.

10. The system of claim 1 wherein the first and second image are aligned with respect to one another by minimizing a sum of the squares distance between the respective images.

11. The system of claim 1 wherein the image of the feature is determined from a sequence of measurements that are recorded over a distance.

* * * * *